United States Patent
Cali et al.

(10) Patent No.: US 10,840,917 B1
(45) Date of Patent: Nov. 17, 2020

(54) CLOCK ALIGNMENT SYSTEM HAVING A DUAL-LOOP DELAY-LOCKED LOOP

(71) Applicant: BAE Systems Information and Electronic Systems Integration Inc., Nashua, NH (US)

(72) Inventors: Joseph D. Cali, Nashua, NH (US); Curtis M. Grens, Manchester, NH (US); Richard L. Harwood, Westford, MA (US); Gary M. Madison, Waltham, MA (US); James M. Meredith, Westford, MA (US); Zachary D. Schottmiller, Nashua, NH (US); Randall M. White, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/707,365

(22) Filed: Dec. 9, 2019

(51) Int. Cl.
| | |
|---|---|
| H03K 5/135 | (2006.01) |
| H03K 5/133 | (2014.01) |
| H03L 7/081 | (2006.01) |
| H03L 7/07 | (2006.01) |
| H03L 7/08 | (2006.01) |
| G06F 1/10 | (2006.01) |

(52) U.S. Cl.
CPC .............. *H03L 7/0814* (2013.01); *G06F 1/10* (2013.01); *H03K 5/133* (2013.01); *H03K 5/135* (2013.01); *H03L 7/07* (2013.01); *H03L 7/0805* (2013.01)

(58) Field of Classification Search
CPC ..... H03L 7/06; H03L 7/07; H03L 7/08; H03L 7/0805; H03L 7/081; H03L 7/0812; H03L 7/0814; G06F 1/04; G06F 1/10; G06F 1/12; H03K 5/13; H03K 5/133; H03K 5/135
USPC ................................................. 327/144–159
See application file for complete search history.

(56) References Cited

U.S. PATENT DOCUMENTS

2014/0133252 A1* 5/2014 Ikeda ................... G11C 7/1036
365/193

* cited by examiner

*Primary Examiner* — Diana J. Cheng
(74) *Attorney, Agent, or Firm* — Finch & Maloney PLLC; Scott J. Asmus

(57) ABSTRACT

A clock alignment system includes a first clock generator generating a first clock signal in a first clock domain and a second clock generator generating a second clock signal in a second clock domain slower than the first clock domain. A coarse delay-locked loop (DLL) generates third clock signals having corresponding phase offsets from the first clock signal, and a fine DLL generates a fourth clock signal by adjusting the phase of a selected one of the third clock signals. The second clock generator generates the second clock signal from the fourth clock signal. A phase detector compares phases of the first and second clock signals. A control circuit aligns the first and second clock signals by using the compared phases to select the third clock signal output by the coarse DLL, and control the phase adjustment by the fine DLL of this third clock signal.

18 Claims, 7 Drawing Sheets

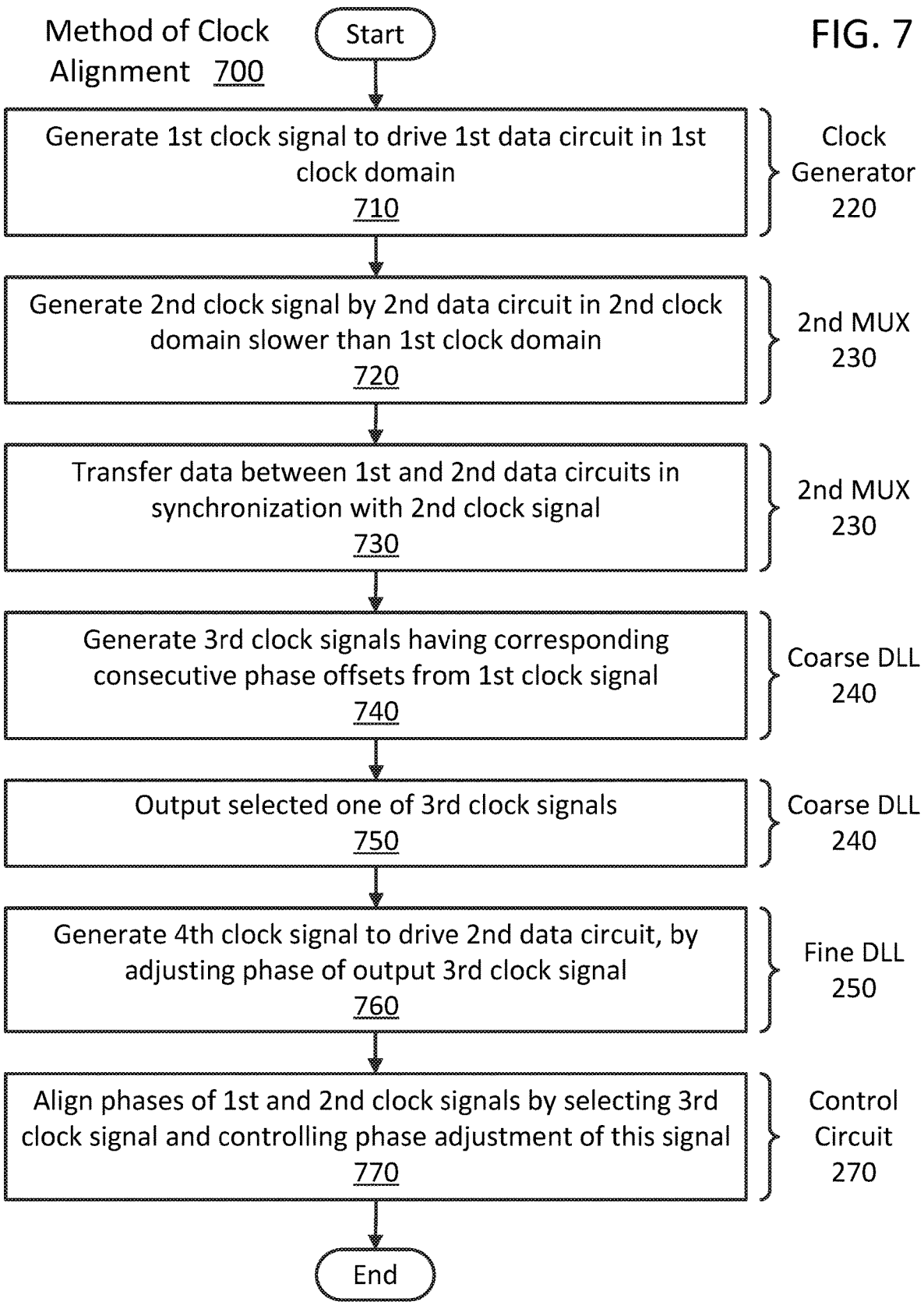

CLOCK ALIGNMENT SYSTEM HAVING A DUAL-LOOP DELAY-LOCKED LOOP

BACKGROUND

In applications that utilize high-frequency serializers having a wide bit-width, such as those employing a digital-to-analog converter (DAC) or a direct digital frequency synthesizer (DDS), there may be multiple clock domains that need to be synchronized. These clock domains can include, for example, a first clock domain for driving the high-frequency serializer, and a second clock domain for driving the lower-frequency data producing circuits (or data consuming circuits) for the serializer. There are a number of non-trivial issues associated with keeping multiple clock domains synchronized.

BRIEF DESCRIPTION OF THE DRAWINGS

FIG. 7 is a flow diagram of an example method of clock alignment, such as for the clock alignment system of FIGS. 2 and 3, according to an embodiment of the present disclosure.

Figure 1:
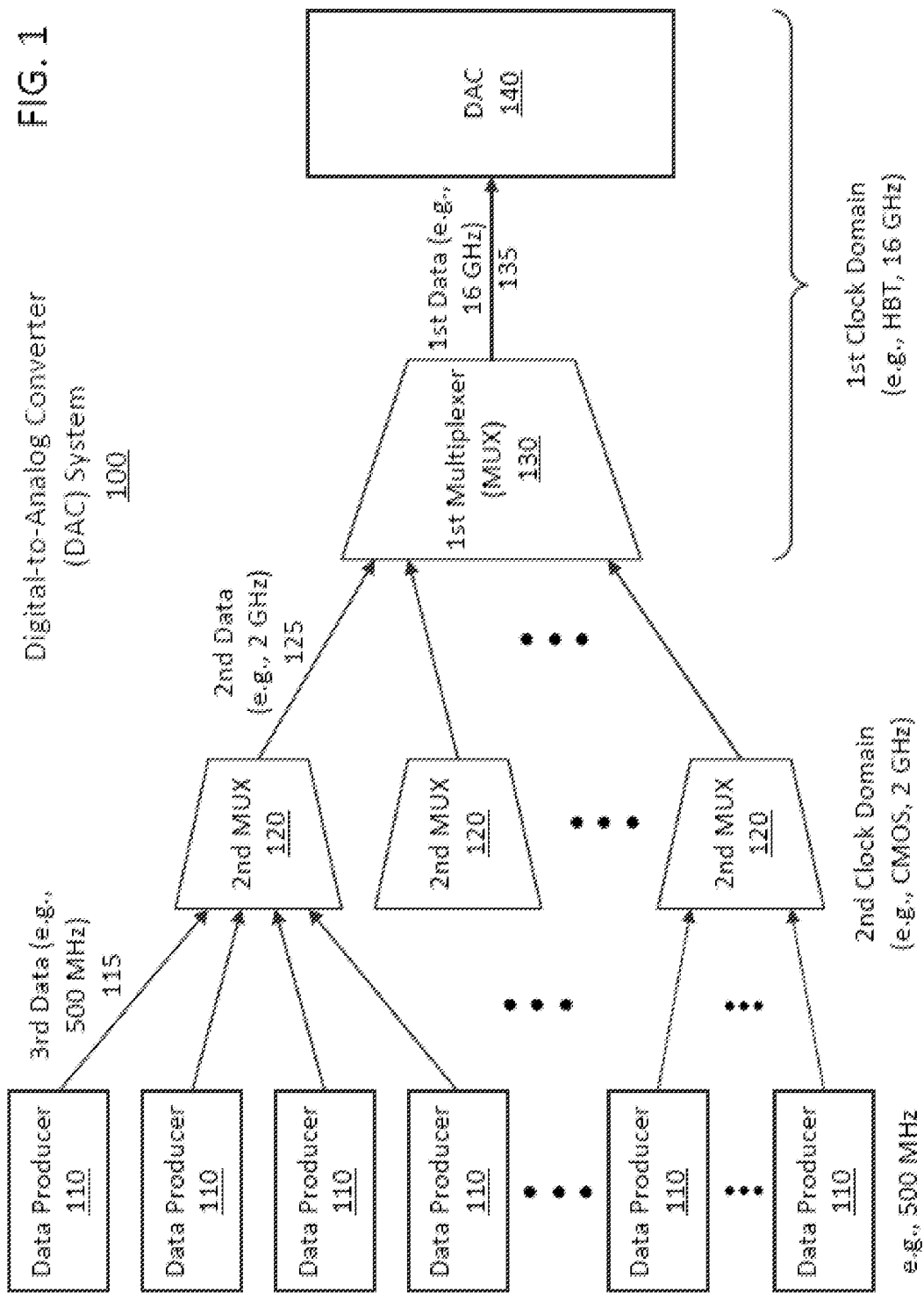
FIG. 1 is a block diagram of an example digital-to-analog converter (DAC) system that includes a high-frequency serializer having a wide bit-width, according to an embodiment of the present disclosure.

Although the following Detailed Description will proceed with reference being made to illustrative embodiments, many alternatives, modifications, and variations thereof will be apparent to those in light of the present disclosure.

DETAILED DESCRIPTION

Techniques are provided for phase alignment between multiple clock domains. The techniques employ a dual-loop (coarse and fine) delay-locked loop (DLL) having glitch-less coarse switching and an unlimited phase acquisition range, according to some embodiments, and are particularly useful in high-frequency serializer applications having a wide bit-width, such as those employing a digital-to-analog converter (DAC) or a direct digital frequency synthesizer (DDS), although other suitable applications will be appreciated in light of this disclosure. In one such example embodiment, there are two clock domains: a high-speed (or first) clock domain, and a lower-speed (or second) clock domain. A first or coarse DLL creates a number (e.g., 16) of nearly equally spaced phases of a clock (e.g., such as a 2 gigahertz (GHz) clock), which are used to synchronize the first and second clock domains. So, continuing with the example use case of 16 equally spaced phases of a 2 GHz clock, this works out to approximately 31.25 picoseconds (ps) of delay difference between two adjacent (or consecutive) stages or phases. These phases are connected through a multiplexer (which selects one of the phases) to a second (or fine) DLL. The fine DLL is used to force phase alignment between the launch data edge (second clock domain) and the sampling clock edge (first clock domain). Such a dual-loop DLL configuration further maintains this phase alignment across varying effects such as temperature, process, and voltage variations.

In one embodiment, a clock alignment system includes a clock generator in a first clock domain (e.g., a high frequency domain). The clock generator generates a first clock signal that drives a first data circuit (such as a high-speed multiplexer, or MUX) in the first clock domain. The clock alignment system also includes a second data circuit (or MUX) in a second clock domain (e.g., lower frequency domain) that is slower than the first clock domain. The second data circuit generates a second clock signal and transfers data to (or, in other cases, from) the first data circuit in synchronization with the second clock signal. In such a case, it is desirable to synchronize the first and second clock signals. To this end, the clock alignment system further includes a coarse DLL to generate third clock signals having a corresponding consecutive (e.g., evenly spaced, within a given tolerance) phase offsets from the first clock signal. The coarse DLL outputs a selected one of the third clock signals. In addition, the clock alignment system further includes a fine DLL that generates a fourth clock signal to drive the second data circuit. The fine DLL does this by adjusting the phase of the output third clock signal in accordance with a supplied adjustment value. The clock alignment system further includes a control circuit that aligns the phases of the first and second clock signals. The control circuit does this by selecting the one of the third clock signals generated by the coarse DLL, and by controlling the phase adjustment of the output third clock signal by the fine DLL. As a result, the first and second clock signals, and thus their respective domains, are synchronized.

General Overview

As mentioned above, there are a number of non-trivial issues associated with managing multiple clock domains. For example, in high-frequency serializers having a wide bit-width (such as DACs and direct frequency synthesizers), variations in factors such as temperature, semiconductor process, and voltage on the launching digital circuitry can cause phase alignment problems between the multiple clock domains. For instance, data launched at one frequency (e.g., a lower frequency) from multiple sources can get out of phase alignment when serialized (or captured) using a higher frequency capture clock. If the phase alignment error is severe enough, setup and hold violations may occur at the sampling register, which can result in degraded performance and a higher bit-error rate. In applications such as a digital-to-analog converter (DAC) or a direct digital frequency synthesizer (DDS), this bit-error rate can manifest itself as a dramatic spurious-free dynamic range (SFDR) hit. For example, with mixed-technology designs, such as complementary metal-oxide semiconductor (CMOS) and heterojunction bipolar transistor (HBT) running at very high-frequencies, the temperature variation of the large digital clock tree may range more than an entire clock period. This places an additional stressor to the phase acquisition range of some clock alignment techniques, such as a single delay-locked loop (DLL). Limited phase acquisition range can render such techniques unsuitable for their intended uses in some applications.

Accordingly, and in various embodiments of the present disclosure, a coarse/fine (dual-loop) DLL is provided to actively compensate for the phase error between data and clock. In some such dual-loop DLL embodiments, the phase acquisition range is unlimited across different temperature, voltage, and semiconductor process variations. In some such embodiments, glitch-less coarse multiplexer switching is provided, such as to prevent downstream logic errors caused by clock glitches (e.g., unintended brief changes in clock signal logic levels). Accordingly, as used herein, "glitch-less switching" refers to any switching process that does not cause any clock glitches. In one specific such example embodiment, the dual-loop DLL includes a first (coarse, or discrete) loop that creates 16 nearly equally spaced phases of a 2 GHz clock (e.g., approximately 31.25 ps of delay difference between two adjacent stages, to span the 500 ps clock period of the 2 GHz clock). Other embodiments may utilize any appropriate clock frequency and any number of spaced phases of that clock frequency, as will be appreciated. In any case, these phases are then connected through a multiplexer (or coarse multiplexer) to a second (fine, or continuous) loop that is used to force phase alignment (and minimize or eliminate clock skew) between the launch data edge and the sampling clock edge. This phase alignment remains fixed across temperature, voltage, semiconductor process, and other variations.

For instance, in some embodiments, a coarse-phase multiplexer is implemented with a one-hot encoder interface with staggered assertions to guarantee that a clock is always present during a switching event, such as from switching from one coarse phase offset to an adjacent (or consecutive) phase offset (e.g., 31.25 ps apart). This can help prevent clock glitches when switching between adjacent phase offsets (e.g., the switching is glitch-less with respect to the clock). In addition, the multiplexer can be implemented as a family of pass gates (or transistors) instead of a traditional digital multiplexer, which can help allow an efficient blending of the clock waveforms during transition of consecutive coarse phase offsets. Further, a timed hysteresis technique can be used on the fine loop path to appropriately trigger (such as lessen or minimize) coarse loop multiplexer switching events, such as choosing a coarse phase offset difference that is no more than half the fine loop phase adjustment range.

In some embodiments, the launching data circuit is driven by the output of the fine DLL, which is tuned to half a clock cycle off from the original clock signal generated in the high-speed clock domain. This permits setup and hold times to be properly maintained when transferring data between the two clock domains. Further, each of these driving clock signals (e.g., 2 GHz, half a clock cycle apart) can be clock divided at their respective data circuits and clock domains to generate a common (e.g., 1 GHz) reference clock signal that can be compared and used for clock alignment. When clock divided in the launching data circuit (such as a MUX), this helps keep the data and clock signals in synchronization, as temperature, voltage and semiconductor process variations experienced in the data selection circuits (e.g., flip-flops) are comparable to the same variations taking place in the clock division circuits. The 1 GHz reference clock signal (1000 ps) can also provide for better or smoother phase acquisition range for synchronizing the different driving clock signals for the launching and capturing data circuits.

The dual-loop approaches disclosed herein address two challenges in which other techniques have been deficient. For example, one possible technique includes just a single DLL with a large tuning range (e.g., a full phase-locked loop (PLL) implementation). This, however, can create several problems in the system. For one thing, a PLL-based solution can limit the available tuning range, forcing higher frequencies than the target frequency to keep any phase mismatch within the tuning range. This can lead to the digital portion of an all-digital loop filter needing to achieve tighter timing constraints. In legacy nodes or when running near the operating limits of the standard cells of a semiconductor process technology, this may not be a feasible or practical option. Further, a PLL-based solution has stability and bandwidth concerns not present in DLL-based solutions. In systems where the design must work without a serial peripheral interface like interaction, a DLL offers a more robust solution. In addition, when trying to implement a coarse DLL feeding a fine DLL, care must be taken to not introduce glitches during the coarse multiplexer adjustments. Accordingly, in some embodiments, a block blending approach is achieved through a tree of pass-gate analog multiplexers. This allows the adjacent coarse adjustments to switch without intruding a glitch. By comparison, using traditional multiplexer designs, which feature edge regeneration at the output, prevent such a smooth blending operation and expose the circuit to the risk of glitching.

For ease of description, most of the described embodiments include slower data producing circuits synchronizing with faster data consuming circuits. However, in other embodiments, faster data producing circuits are synchronized with slower data consuming circuits. For further ease of description, most of the described embodiments include primarily 2 GHz clock signals. However, in other embodiments, faster or slower clock signals can be used as would be apparent in light of this disclosure. Numerous other embodiments and configurations will be apparent in light of this disclosure.

System Architecture

FIG. 1 is a block diagram of an example digital-to-analog converter (DAC) system 100 that includes a high-frequency serializer having a wide bit-width, according to an embodiment of the present disclosure. The DAC system 100 and other components described throughout can be an integrated circuit (IC) fabricated, for example, using conventional semiconductor process and forming techniques.

Referring to FIG. 1, the DAC system 100 includes an arrangement of (digital) data producing circuits 110 operating in a relatively slower technology, such as CMOS. For instance, the data producers 110 can each be generating third data 115 at a rate of 500 megahertz (500 MHz). The goal of the DAC system 100 is to process the digital data generated by the data producers 110 (e.g., 32 such data producers 110) through a single high-speed DAC 140 (e.g., implemented in a fast technology such as HBT) at 16 GHz. To accomplish this, the DAC system 100 uses two levels of MUXing. In one level (e.g., the CMOS level, part of the second clock domain), the third data streams 115 from four different data producers 110 are multiplexed into a second MUX 120 running at four times the speed (e.g., 2 GHz) of the data producers 110 to generate second data 125 at 2 GHz. For instance, there can be eight such second MUXs 120 to collect the 32 third data streams 115 and produce eight second data streams 125.

In another level (e.g., the HBT level, part of the first clock domain that is eight times faster than the second clock domain in this case), the eight second data streams 125 are multiplexed into a single first MUX 130 running at 16 GHz to produce a single first data stream 135 at 16 GHz. The first data 135 is input to the DAC 140 (also running at 16 GHz) to convert the digital data to corresponding analog data.

However, as discussed earlier, the two different clock domains and process technologies introduce timing synchronization issues between the different levels of MUXs. Accordingly, in embodiments of the present disclosure, a clock alignment system is used to coordinate the timing of the second MUXs 120 with that of the first MUX 130. Embodiments of the clock alignment system and its circuits and techniques will be described in further detail with reference to FIGS. 2-7.

Figure 2:
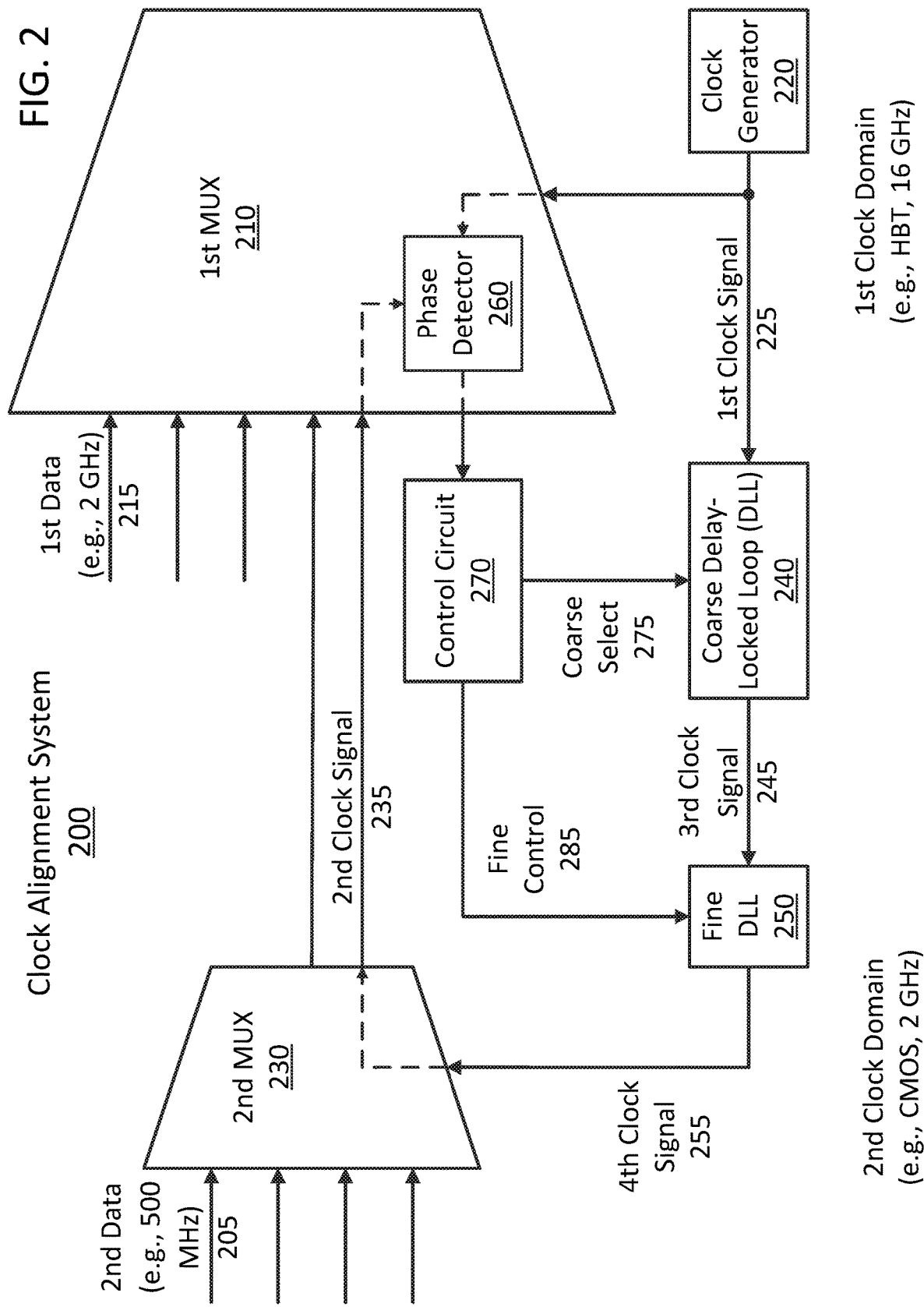
FIG. 2 is a block diagram of an example clock alignment system, such as for use with the DAC system of FIG. 1, according to an embodiment of the present disclosure.

FIG. 2 is a block diagram of an example clock alignment system 200, such as for use with the DAC system 100 of FIG. 1, according to an embodiment of the present disclosure. The system 200 can be used with any number of other high-frequency serializers having a wide bit-width, and the present disclosure is not intended to be limited to DAC-based systems, as will be appreciated in light of this disclosure. The clock alignment system 200 and other electronic components or circuits described herein can be implemented as an integrated circuit in a semiconductor fabrication technology, such as CMOS, n-type MOS (NMOS), or HBT, to name a few.

For example, the clock alignment system 200 and other circuits disclosed herein may be custom hardware circuits or computer circuits configured (e.g., through predefined or customized logic, to name a few) to carry out the tasks assigned to the circuit. While circuits are illustrated as being made up of other circuits by function, in other embodiments, two or more circuits may be combined into a single circuit performing the functionality of the two or more circuits. In still other embodiments, a single circuit can be divided into two or more circuits, each performing separate functions performed by the single circuit. As will be further appreciated, a circuit as used herein is a physical structure capable of carrying out one or more functionalities as variously provided herein. For example, the structure can be hardware such as purpose-built semiconductor (e.g., gate-level logic or application specific integrated circuit) or a printed circuit board populated with discrete components configured and arranged to carry out the various functionalities provided herein. Numerous such embodiments and configurations will be appreciated in light of this disclosure.

Referring to FIG. 2, the clock alignment system 200 includes a first MUX 210 (or first data circuit) to multiplex several (e.g., four or more, such as eight) separate first data streams 215 into a single output data stream. The first MUX 210 is implemented in a first (e.g., high speed) clock domain. For ease of description, the first MUX 210 will be assumed to be implemented in HBT running at 16 GHz, though other embodiments are not so limited, and can be implemented in various technology processes and speeds, as would be apparent in light of this disclosure. It will also be assumed that the first data streams 215 are 2 GHz data streams, and that there are eight such first data streams 215 being multiplexed by the first MUX 210, though other embodiments are not so limited.

While the first MUX 210 is being driven at 16 GHz and whose clock signal can be generated by a single clock generator, for ease of description, the 16 GHz clock signal is clock divided into eight separate (and offset) 2 GHz clock signals to drive the corresponding first data streams 215 through the first MUX 210. Accordingly, a single clock generator 220 in the first clock domain is shown generating a first clock signal 225 (e.g., at 2 GHz and corresponding phase offset) to drive one such first data stream 215 through the first MUX 210. In addition to driving the corresponding capture circuit in the first MUX 210, the first clock signal 225 ultimately drives the launching data circuit (second MUX 230) as will be described. The second MUX 230 generates one of the first data streams 215 in synchronization with a second clock signal 235 (that the second MUX 230 also generates, ultimately from the first clock signal 225).

The first clock signal 225 is input to a coarse DLL 240, which generates numerous (e.g., quantized) third clock signals that are phase-delayed versions of the first clock signal 225. For instance, the third clock signals can be evenly spaced clock signals that span the clock period of the first clock signal 225, which helps permit unlimited phase acquisition range. As used herein, the term "unlimited phase acquisition range" refers to the ability to select any clock phase between one full clock cycle. Note that the phrase evenly spaced as used herein is not intended to imply perfectly spaced clock signals; rather, evenly spaced is intended to imply a spacing accuracy among the clock signals that is suitable for a given application. In one embodiment, the coarse DLL 240 is implemented as a voltage-controlled delay line (VCDL) having as many taps (e.g., 16) as the number of third clock signals. For example, there can be 16 such third clock signals, with a spacing of about 31.25 ps between consecutive third clock signals, altogether spanning the 500 ps clock period of the 2 GHz first clock signal 225.

The output of the coarse DLL 240 is a selected one of the third clock signals (or selected third clock signal 245). The selected (or output) third clock signal 245 is input to a fine DLL 250 to impart a finer phase adjustment to the third clock signal 245. As such, the fine DLL 250 can also be a VCDL (e.g., without any taps) that further delays the phase of the third clock signal 245 (to generate a fourth clock signal 255 having the same frequency as the third clock signal 245) in accordance with a supplied voltage value. The fine DLL 250 should have a tuning range at least that of the spacing between consecutive third clock signals, to help permit unlimited phase acquisition range. In some embodiments, the fine DLL 250 has a tuning range at least twice that of the adjacent third clock signal spacing, to reduce chatter or bouncing that can take place when oscillating between adjacent third clock signals of the coarse DLL 240 being selected.

The fourth clock signal 255 is used to drive the second MUX 230, which receives and multiplexes a plurality of second data streams 205 (e.g., 4 data streams at 500 MHz apiece) to generate its corresponding first data stream 215 (e.g., at 2 GHz). The second MUX 230 generates the second clock signal 235 (to synchronize with the first data stream 215) and transmits the second clock signal 235 in parallel with the first data stream 215. For example, the second clock signal 235 can be generated in sufficient proximity of the generation of the first data stream 215 within the second MUX 230 (or second data circuit) that it reflects similar timing variations due to factors such as temperature, process, and voltage that the data stream generation experiences. As such, the second clock signal 235 stays in synchronization with the first data stream 215 even with environmental variations.

A phase detector 260 in the first clock domain, such as in the first MUX 210 (or first data circuit), compares the phases of the first clock signal 225 and the second clock signal 235. The output of the compared phases is input to a control circuit 270, which controls the coarse DLL 240 and the fine DLL 250 to keep the first clock signal 225 and the second clock signal 235 in synchronization with each other (such as precisely half a clock period apart from each other). For example, the control circuit 270 can output a coarse select signal 275 to control which of the third clock signals (e.g., phase offsets from the first clock signal 225) generated in the coarse DLL 240 is selected as the output third clock signal 245. In addition, the control circuit 270 can control the fine adjustment of the phase delay of the third clock signal 245 by supplying a fine control signal 285 to the fine DLL 250. For instance, the fine control signal 285 can control the VCDL within the fine DLL 250 to adjust the delay of the third clock signal 245 to a different amount when generating the fourth clock signal 255.

Figure 3:
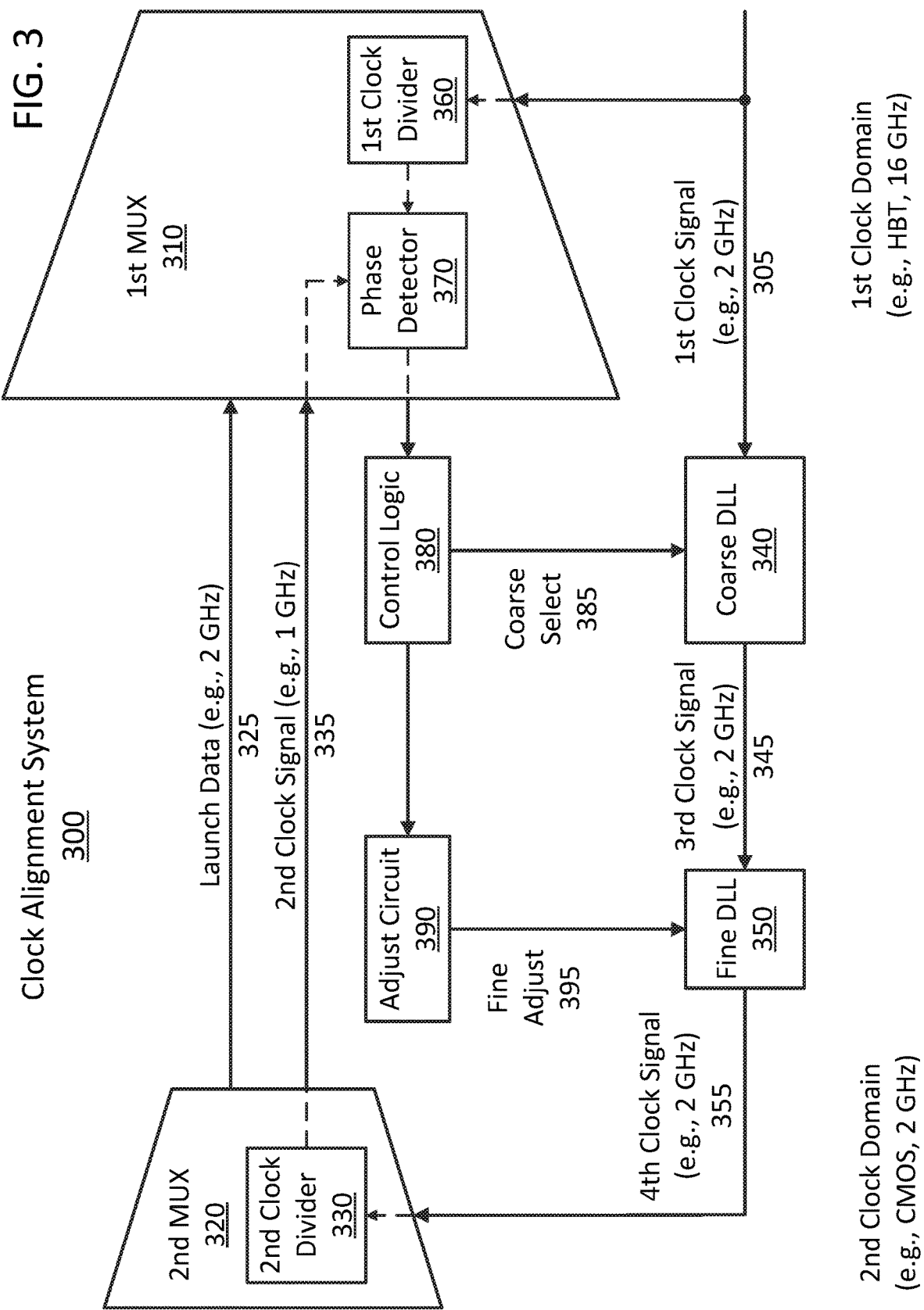
FIG. 3 is a block diagram of an example clock alignment system, such as for use with the DAC system of FIG. 1, according to another embodiment of the present disclosure.

FIG. 3 is a block diagram of an example clock alignment system 300, such as for use with the DAC system of FIG. 1, according to another embodiment of the present disclosure. The clock alignment system 300 includes similar components, signals, and clock domains to the clock alignment system 200, such as first clock signal 305, first MUX 310, second MUX 320 (which generates launch data 325 and second clock signal 335), coarse DLL 340, third clock signal 345, fine DLL 350, fourth clock signal 355, and phase detector 370. In addition, to better synchronize the launch data 325 to the second clock signal 335, the second MUX 320 includes a second clock divider 330 to both divide the fourth clock signal 355 into the second clock signal 335 (at half the frequency). The second clock divider 330 can also simulate the same or similar variation experienced in the data select path (that generates the launch data 325) in the second MUX 320. For example, in some implementations, variations due to factors such as temperature, process, and voltage can cause a corresponding 100 ps variation in the launch data 325 versus the fourth clock signal 355 used to drive the launch data 325. Likewise, a first clock divider 360 in the first clock domain is used to divide the first clock signal 305 prior to comparing its phase to that of the second clock signal 335 in the phase detector 370.

Accordingly, while the launch data 325 (as driven by the fourth clock signal 355) and the first clock signal 305 may be half a clock cycle apart (e.g., to keep the first MUX 310 from consuming the launch data 325 while the second MUX 320 is producing it), the second clock signal 335 and the divided first clock signal 305 can be identical (or in-phase), only half the frequency of the first clock signal 305. The output of the phase detector 370 can be used to drive the control logic 380, which accumulates (e.g., integrates, such as with a cascaded integrator comb (CIC) filter) any change in phase alignment between the first clock signal 305 and the second clock signal 335, as detected by the phase detector 370. The control logic 380 generates the coarse select signal 385 to select which of the third clock signals generated by the coarse DLL 340 is used as the output third clock signal 345. Further, an output of the control logic 380 controls the adjust circuit 390 to output a corresponding fine adjust signal 395 to control the phase delay imparted by the fine DLL 350 on the third clock signal 345.

When a sufficient phase misalignment (or clock skew) is detected or accumulated by the control logic 380, an appropriate change (usually a small adjustment in the fine DLL 350) is passed to the adjust circuit 390, which converts the adjustment to a corresponding fine adjust signal 395 (or voltage) to adjust the output third clock signal 345 at the fine DLL 350. In some cases, such as when nearing an end of the tuning range of the fine DLL 350, a coarse adjustment to the first clock signal 305 is warranted, so the control logic 380 selects an adjacent coarse select signal 385 for the coarse DLL 340 and modifies the adjustment supplied to the adjust circuit 390 to account for this new third clock signal 345 being selected.

In further detail, the fine DLL 350 can have a tuning range of the third clock signal 345, such as between two and four times the spacing of adjacent third clock signals generated by the coarse DLL 340. For example, when the third clock signals are spaced apart by 31.25 ps, the fine DLL 350 can have a phase adjustment range of between 62.5 ps and 125 ps, such as 120 ps. When the fine DLL 350 has less than twice the third clock signal spacing for its tuning range, the design risks excessive bouncing or chatter (e.g., oscillating between extremes of the tuning range when adjusting the coarse select signal 385). In addition, when the fine DLL 350 has more than four times the third clock signal spacing for its tuning range, the fine DLL 350 may not lock (which limits phase acquisition range) and the design of the fine DLL 350 risks excessive complexity or loss of precision as it is forced to cover more ground, for example, with the same VCDL.

To complement the fine DLL 350 and its corresponding tuning range, the coarse DLL 340 generates numerous (e.g., more than four, such as eight or 16, though there is no requirement that this number be a power of two) third clock signals whose spacing is sufficiently small that the fine DLL 350 can efficiently fine tune the phase of the output third clock signal 345. Generating too many third clock signals (such as 32 or more) complicates the coarse DLL design, and can lead to less accurate third clock signals and their corresponding spacing between adjacent or consecutive third clock signals. Generating too few third clock signals (such as four or fewer) greatly increases the risk of glitching between changing the selected third clock signal 345, and significantly increases the fine adjustment range needed to be covered by the corresponding fine DLL 350. It can be convenient for the number of third clock signals to exceed the ratio of the different clock domain speeds (e.g., of the speed of the first clock domain to that of the second clock domain). This allows the fine DLL 350 to work on a granularity that is smaller than the operating frequency of the first MUX 310.

To reduce, minimize, or eliminate glitching when switching between third clock signals output by the coarse DLL 340, the control logic 380 and coarse DLL 340 can employ several techniques. While variations in the temperature, process, and voltage between the different clock domains can cause phase misalignment of the first clock signal 305 and the second clock signal 335, the amount of variation changes relatively slowly compared to the clock signals themselves. Accordingly, from a necessary or practical standpoint, the control logic 380 can run at considerably slower speeds, such as a few kilohertz (KHz) or a few tens of KHz, like 10 KHz or 20 KHz, to keep up with 2 GHz clock signal variations. Further, changes in the third clock signal 345 should be minimized, as such changes are the most likely sources of clock glitches. Accordingly, when the third clock signal 345 needs to be changed (e.g., the course select signal 385 needs to select a different one of the third clock signals), it should only be changed to an adjacent (or consecutive) third clock signal (e.g., 31.25 ps apart using the above example timings). This greatly reduces the chance and the duration of a change in clock signal sufficient to induce a clock glitch.

More specifically, in some embodiments, the control logic 380 only switches the coarse select signal 385 to an adjacent value, and then only when necessary to make a coarse phase adjustment between the first clock signal 305 and the second clock signal 335. For instance, by keeping the spacing between third clock signals small, and the tuning range of the fine DLL 350 sufficiently large to span several (e.g., three) such spacings, there is ample fine DLL tuning range to reduce or eliminate chatter (or bouncing) when oscillating between small differences in phase alignment. Put another way, the control circuitry of the fine DLL 350 employs a type of hysteresis to absorb such oscillating behavior using fine DLL's (sufficiently large) tuning range rather than requiring numerous coarse adjustments in the coarse DLL 340 back and forth between adjacent third clock signals.

Figure 4:
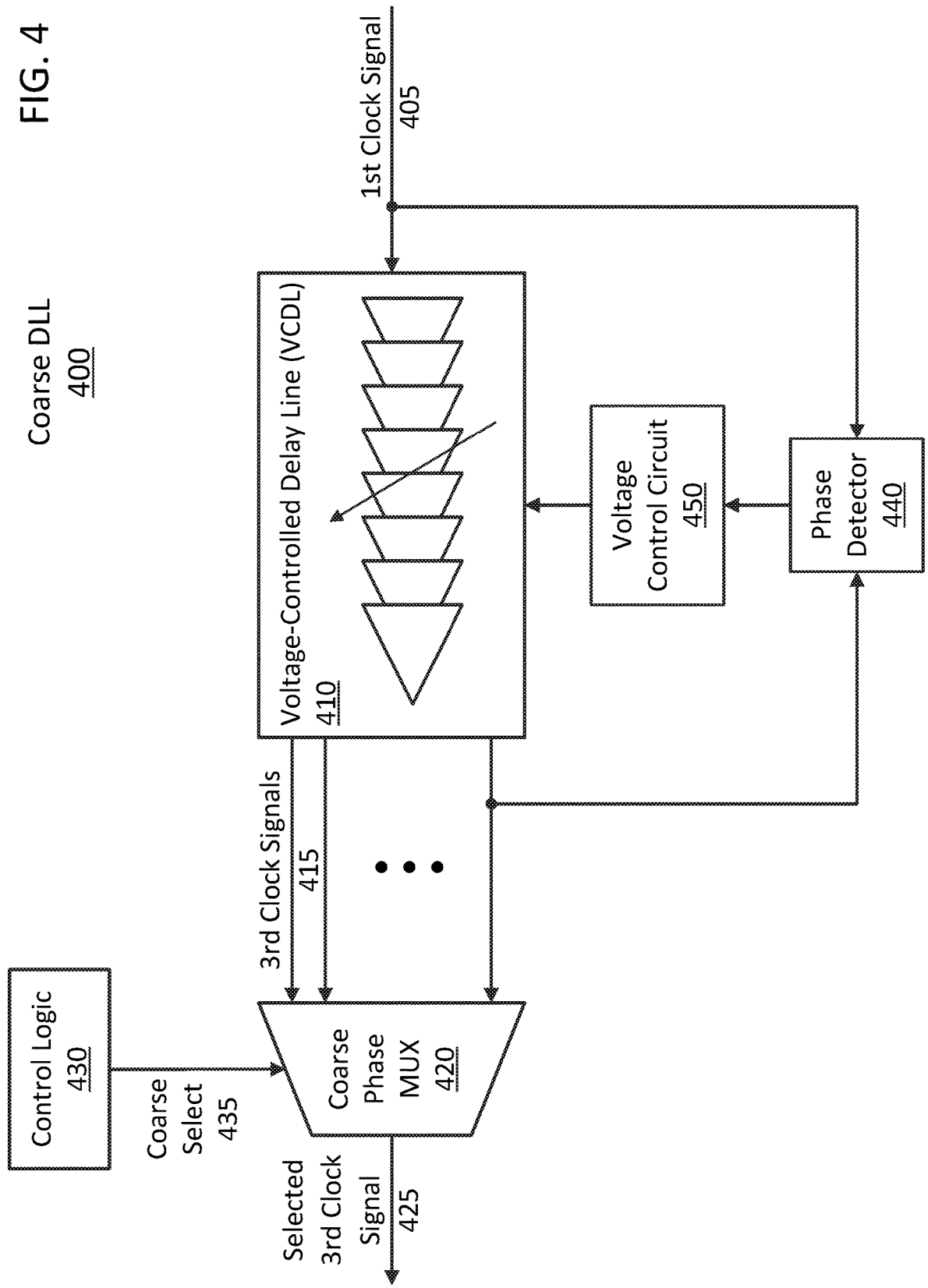
FIG. 4 is a block diagram of an example coarse delay-locked loop (DLL), such as for use with the clock alignment systems of FIGS. 2 and 3, according to an embodiment of the present disclosure.

FIG. 4 is a block diagram of an example coarse DLL 400, such as for use with the clock alignment system 200 of FIG. 2 or clock alignment system 300 of FIG. 3, according to an embodiment of the present disclosure. The coarse DLL 400 receives a first clock signal 405, generates numerous third clock signals 415 having different respective phase delays of the first clock signal 405, and outputs a selected third clock signal 425 having the same frequency but a (possibly) different phase as the first clock signal 405. The selected third clock signal 425 is a coarse (e.g., discrete or quantized) adjustment to the phase of the first clock signal 405 and is input to a fine DLL (such as fine DLL 350 in FIG. 3) to impart a fine (e.g., continuous) adjustment of the phase delay.

In further detail, the coarse DLL 400 includes a voltage-controlled delay line (VCDL) 410 having a loop of N voltage-controlled delay stages or buffers, each of which can impart a variable delay on the first clock signal 405 under the control of a variable supplied voltage supplied by a voltage control circuit 450. Each of the N stages also has a tap to output its respective phase-delayed first clock signal, to produce N separate (and consecutive) phase delays of the first clock signal 405. These N phase-delayed clock signals are referred to as third clock signals 415. Their different phase delays span the clock period of the first clock signal 405. In some embodiments, the phase delays are evenly spaced, such as 1/Nth of the clock period of the first clock signal 405 apart. For instance, the N stages can be similar buffer circuits each receiving the same variable control voltage, to impart a consistent delay at each stage.

Further, the Nth delay output (or tap) can be compared to the input first clock signal 405 using phase detector 440 to compare the phase alignment of the (undelayed) first clock signal 405 with that of the (N times delayed) last third clock signal 415. The phase detector 440 can accumulate any clock skew (or phase misalignment) and adjust the VCDL 410 by directing the voltage control circuit 450 to adjust its voltage signal to the VCDL 410 to bring the first clock signal 405 and the last third clock signal 415 into alignment. Once aligned (e.g., one clock cycle apart), the remaining third clock signals 415 (from their respective taps in the delay loop) should be evenly spaced and impart a separate 1/Nth of the clock period phase delay on the first clock signal 405.

To minimize or eliminate glitching caused when selecting different (e.g., adjacent) third clock signals 415, in some embodiments, the coarse select signal 435 is implemented with a one-hot encoder interface with staggered assertions (e.g., make before break, such as selecting two adjacent clock signals at once with a relatively small overlap in time) to guarantee that a third clock signal 425 is always present during a switching event. To further reduce or minimize such glitching, in some embodiments, the spacing between adjacent third clock signals is made sufficiently small that in the unlikely event that the adjacent clock signals being switched currently have different clock signal values, there is not sufficient time during the overlap window for the output clock signal to glitch. To even further reduce or minimize such glitching, in some embodiments, the coarse phase MUX 420 is implemented as a family of pass gates instead of a traditional digital multiplexer, to slow down rise and fall times and allow an efficient blending of the block waveform during transition. As such, the blended clock signal output as the selected third clock signal 425 does not experience a sufficient change in value to induce a clock glitch in the downstream logic.

The value of N can vary depending on implementation. For example, N can be some value greater than 4, such as 8 or 16, but N does not have to be a power of two. When N is large (such as more than 32), it can complicate the design of the coarse DLL, produce less accurate phase spacing between adjacent third clock signals 415, and complicate the control logic to manage the coarse DLL 400. When N is small (such as 4 or less), it can significantly increase the risk of glitching between switching coarse DLL outputs by the coarse phase MUX 420 and result in too large a tuning range for the corresponding fine DLL to efficiently perform the follow-on fine adjustment to the selected third clock signal 425.

Figure 5:
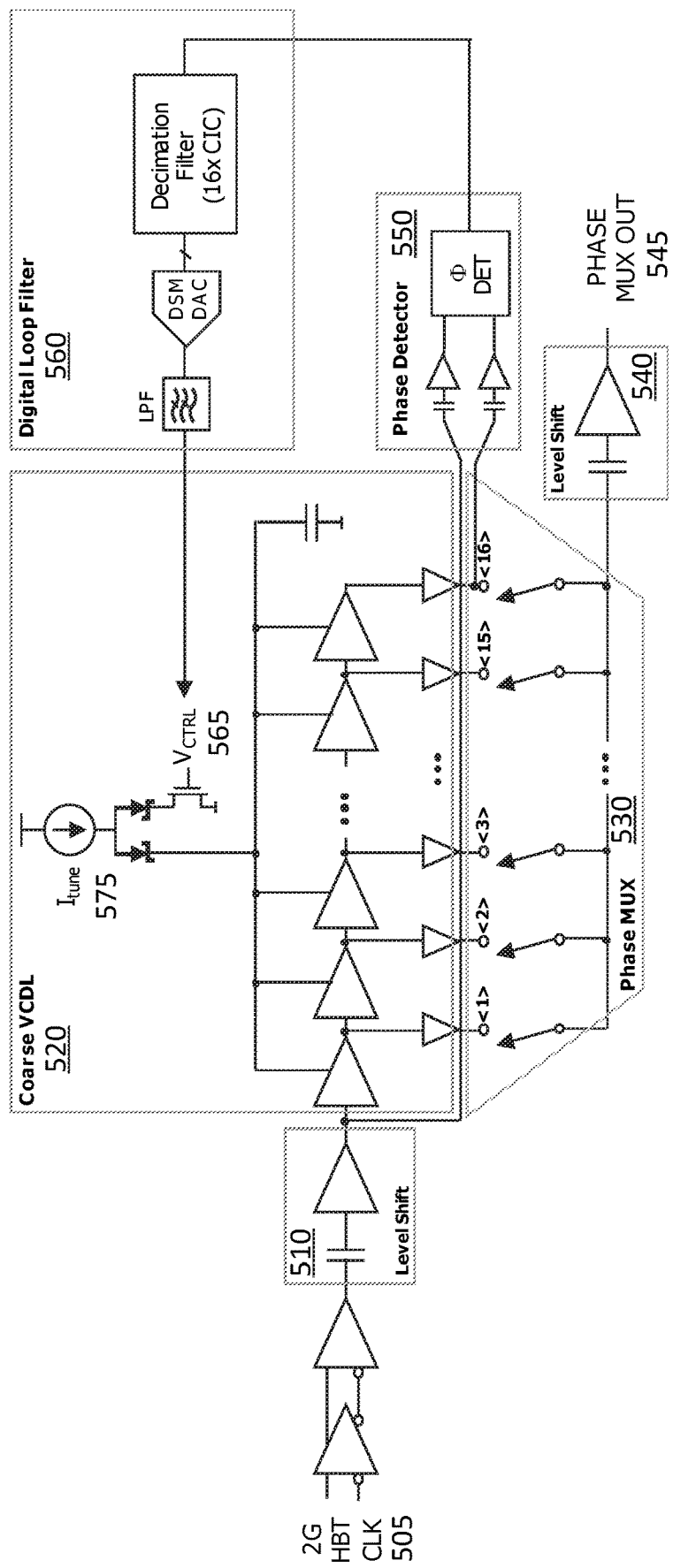
FIG. 5 is a circuit diagram of the example coarse DLL of FIG. 4, according to an embodiment of the present disclosure.

FIG. 5 is a circuit diagram of an example coarse DLL 500, according to an embodiment of the present disclosure. Coarse DLL 500 provides a more detailed implementation of coarse DLL 400, according to an embodiment. The coarse DLL 500 receives a first clock signal (e.g., a 2 GHz HBT domain clock signal) 505, which is input to a level shifter 510 to, for example, convert the signal to the appropriate voltage for a CMOS domain in which the remainder of the coarse DLL 500 is implemented. For example, the HBT domain can be a data consuming domain for implementing a high-speed DAC. In one embodiment, capacitive-coupled level-shifters (such as level shifter 510) capable of preserving 50% duty cycle of the clock waveform over the tuning range are used.

The output of the level shifter 510 is split two ways, to drive two different circuits. The first such circuit is a coarse VCDL 520, where the input is delayed, in this example case, 16 times (16-way VCDL) through a chain of a corresponding 16 voltage-controlled delay buffers to create a corresponding 16 delayed versions (e.g., third clock signals) of the first clock signal. In one embodiment, the coarse VCDL 520 is a 16-tap VCDL that locks to a 2 GHz input clock, providing 16 equal phase steps at the output. For instance, each of the third clock signals can be delayed a different increment, such as a different multiple of 1/16th of the 2 GHz clock period (or 32.25 ps) of the first clock signal. The second such circuit is a phase detector 550, where the input is compared to the final output (e.g., 16th delayed) signal of the coarse VCDL 520. In addition, a phase MUX 530 (e.g., using one-hot encoding with staggered assertions and pass transistor logic) is used to select (e.g., under control of a coarse select signal, such as coarse select 435) one of the third clock signals (phase offsets) output by the coarse VCDL 520.

The selected third clock signal of the phase MUX 530 is received by another level shifter 540 to produce the output third clock signal 545 in a form suitable for, e.g., driving a data producing domain (such as the same or another CMOS domain) for supplying digital values to the high-speed DAC. Meanwhile, the phase detector 550 receives copies of the first clock signal before and after being delayed 16 times, to see if the two signals are in-phase (e.g., each of the third clock signals is a different 32.25 ps phase offset from the first clock signal) or out-of-phase. The amount of phase misalignment (if any) is input to a digital loop filter 560, where in some embodiments, the misalignment goes through a decimation filter (such as a 16-way CIC filter), whose digital output drives an analog modulator (such as a delta-sigma modulator (DSM) DAC), whose analog output is passed through a low-pass filter (LPF). The output of the LPF is a control voltage $V_{CTRL}$ 565 suitable to drive the delay circuits in the coarse VCDL 520, such as by driving a transistor to control a corresponding tuning current $I_{TUNE}$ 575. In one embodiment, the coarse VCDL 520 is tuned by a diode pair that steers tuning current into the delay line supply node.

In further detail, when the phase detector 550 detects that the delayed signal is ahead of the (input) first clock signal, the output of the phase detector 550 causes the digital loop filter 560 to generate a control voltage 565 that slows down the delay buffers in the coarse VCDL 520 sufficiently to align the delayed signal with the first clock signal. Similarly, when the phase detector 550 detects that the delayed signal is behind the first clock signal, the output of the phase detector 550 causes the digital loop filter 560 to generate a control voltage 565 that speeds up the delay buffers in the coarse VCDL 520 sufficiently to align the delayed signal with the first clock signal. Further, when the phase detector 550 detects that the delayed signal is aligned with the first clock signal, the output of the phase detector 550 causes the digital loop filter 560 to maintain the same control voltage 565, to maintain the alignment of the delayed signal with the first clock signal.

Figure 6:
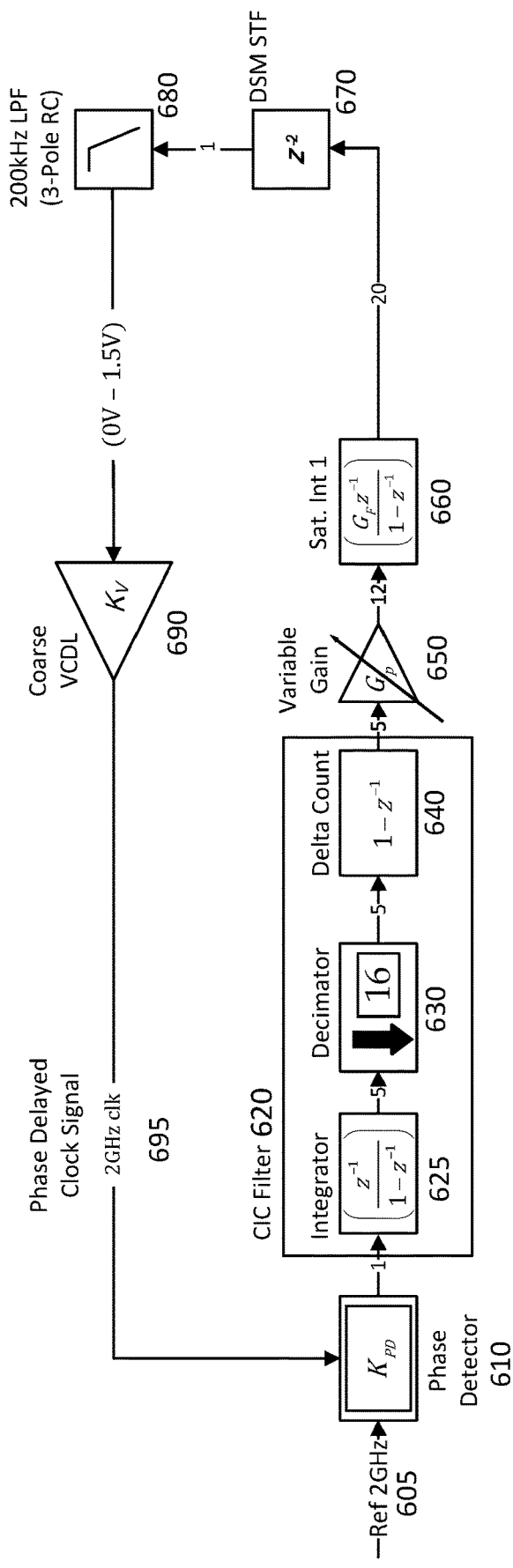
FIG. 6 is a schematic diagram of a coarse DLL having a more detailed illustration of a digital loop filter, according to an embodiment of the present disclosure.

FIG. 6 is a schematic diagram of a coarse DLL 600 having a more detailed illustration of a digital loop filter, according to an embodiment of the present disclosure. The digital loop filter may be used with the coarse DLL 500 of FIG. 5, according to an embodiment. The coarse DLL 600 includes a phase detector 610, which receives a reference clock signal 605 (such as a 2 GHz reference clock signal) and a phase delayed clock signal 695 (such as a final phase delayed signal 695 of the 2 GHz reference clock signal 605 from a VCDL). When the coarse DLL 600 is tuned, the two input clock signals to the phase detector 610 are in phase, one full clock cycle (e.g., 500 ps) apart. The phase detector 610 samples the two input clock signals to identify, for example, which clock signal is ahead of the other. The phase detector 610 outputs these samples to a CIC filter 620, such as a low-pass filter (LPF) that performs 16× (16 times) decimation.

In one embodiment, the CIC filter 620 includes an integrator 625, a decimator 630, and a delta count circuit 640. The integrator 625 accumulates (e.g., integrates) the phase comparison data from the phase detector 610 over time. The integrator 625 outputs this accumulation to the decimator 630 (such as a 16× decimator) to downsample the integrator output (e.g., by a factor of 16). The output of the decimator 630 is passed to a delta count circuit 640 to increment the decimated output over time. The output of delta count circuit 640 is passed to a variable-gain circuit (such as a variable-gain amplifier) 650 to boost (or amplify) the delta count output by a variable (such as a programmable) amount. The output of the variable gain circuit 650 is passed to a saturation integrator 660 to integrate (e.g., accumulate) over time, subject to a saturation (e.g., maximum) value.

The saturation integrator output is input to a delta sigma modulator (DSM) signal transfer function (STF) circuit 670, to perform delta sigma modulation together with a transfer function on the (possibly saturated) accumulated input. The output of the DSM STF circuit 670 is passed to a low pass filter (LPF) 680, such as a 200 kilohertz (kHz) LPF with a three-pole resistor-capacitor (RC) structure. The output of the LPF 680 is a voltage whose value corresponds to the amount of delay in each delay stage of a coarse VCDL 690 used to generate the different phase delayed (e.g., 16 consecutive or incremental phase delays of the) output clock signals of the coarse VCDL 690.

For example, when the reference clock signal 605 and the last output clock signal 695 of the coarse VCDL 690 are in phase, the output of the LPF 680 remains the same, to keep the input clock signals to the phase detector 610 in phase and each of the phase delayed output clock signals of the coarse VCDL 690 with the proper phase spacing (such as ¹⁄₁₆th of a clock cycle apart). In addition, when the final output clock signal 695 gets ahead of the reference clock signal 605, the output of the LPF 680 adjusts to increase the delay of the voltage-controlled delay buffers in the VCDL 690 and bring the final output clock signal 695 in alignment with the reference clock signal 605. Further, when the final output clock signal 695 gets behind the reference clock signal 605, the output of the LPF 680 adjusts to decrease the delay of the voltage-controlled delay buffers in the VCDL 690 and bring the final output clock signal 695 in phase with the reference clock signal 605.

The example components and circuits of FIGS. 1-6 can vary (or not even be included) in different embodiments. For example, in some embodiments, the coarse VCDL outputs, e.g., 17 clock signals, each ¹⁄₁₆th of a clock cycle apart, with the 1st and 17th clock signals being used as inputs to the phase detector of the coarse DLL, and the coarse phase MUX receives 16 consecutive outputs (e.g., the 1st through 16th phase delayed clock signals) of the coarse VCDL. In addition, the different numbers used throughout (such as the speed of the clock domains, ratio of the speeds of the clock domains, number of stages in the VCDLs, number of outputs of the VCDLs, to name a few) can vary between embodiments, and do not have to be a power of two. In addition, in different embodiments, the high-speed domain is not implemented in HBT technology.

Methodology

FIG. 7 is a flow diagram of an example method 700 of clock alignment, such as for the clock alignment system 200 of FIG. 2 or the clock alignment system 300 of FIG. 3, according to an embodiment of the present disclosure. The method 700 may be performed, for example, by the clock alignment systems and components of FIGS. 1-6. More generally, the method 700 and other methods described herein may be implemented in hardware or combinations of hardware and software. For example, the method 700 may be implemented by the clock alignment system 200 of FIG. 2 or the clock alignment system 300 of FIG. 3. Throughout the description of the method 700, references may be made to corresponding components of the clock alignment systems and various circuits of FIGS. 1-6. In another embodiment, the method 700 may be implemented by a custom circuit such as a clock alignment circuit with custom processing circuits configured to carry out the method 700. In other embodiments, the method 700 may be performed in conjunction with a special purpose processor, such as a signal processor. In addition, while the methods described herein may appear to have a certain order to their operations, other embodiments may not be so limited. Accordingly, the order of the operations can be varied between embodiments, as would be apparent in light of this disclosure.

Referring to the method 700 of FIG. 7, an integrated circuit (IC) structure, such as an IC implementation of the clock alignment system 200, begins with generating 710, by a clock generator (such as clock generator 220) in a first clock domain (such as a high speed domain, like an HBT domain), a first clock signal (such as first clock signals 225, 305, and 405) to drive a first data circuit (such as first MUXs 130, 210, and 310) in the first clock domain. The method 700 further includes generating 720 a second clock signal (such as second clock signals 235 and 335) by a second data circuit (such as second MUXs 120, 230, and 320) in a second clock domain (such as a lower speed domain, like a CMOS domain) that is slower than the first clock domain. The method 700 further includes transferring 730, by the second data circuit, data (such as second data 125, first data 215, and launch data 325) to or from the first data circuit in synchronization with the second clock signal. The method 700 further includes generating 740, by a coarse delay-locked loop (DLL, such as coarse DLLs 240, 340, and 400), third clock signals (such as third clock signals 415) having corresponding consecutive (such as evenly spaced) phase offsets from the first clock signal.

The method 700 further includes outputting 750, by the coarse DLL, a selected one of the third clock signals (such as third clock signal 245, third clock signal 345, and selected third clock signal 425). The method 700 further includes generating 760, by a fine DLL (such as fine DLLs 250 and 350), a fourth clock signal (such as fourth clock signals 255 and 355) to drive the second data circuit, by adjusting the phase of the output third clock signal. The method 700 further includes aligning 770, by a control circuit (such as control circuit 270, control logic 380, control logic 430, and adjust circuit 390), the phases of the first and second clock signals by selecting the one of the third clock signals output by the coarse DLL and controlling the phase adjustment of the output third clock signal by the fine DLL. For instance, in some embodiments, a phase detector (such as phase detectors 260 and 370) in the first clock domain compares the phases of the first and second clock signals, while the control circuit uses this comparison to select which of the third clock signals to output from the coarse DLL and to control the (fine) phase adjustment by the fine DLL of this selected third clock signal.

Numerous other methods and techniques will be apparent in light of the present disclosure.

Further Example Embodiments

The following examples pertain to further embodiments, from which numerous permutations and configurations will be apparent.

Example 1 is a clock alignment system including: a clock generator in a first clock domain, to generate a first clock signal to drive a first data circuit in the first clock domain; a second data circuit in a second clock domain slower than the first clock domain, the second data circuit being to generate a second clock signal and to transfer data to or from the first data circuit in synchronization with the second clock signal; a coarse delay-locked loop (DLL) to generate third clock signals having corresponding consecutive phase offsets from the first clock signal, and to output a selected one of the third clock signals; a fine DLL to generate a fourth clock signal to drive the second data circuit, by adjusting the phase of the output third clock signal; and a control circuit to align the phases of the first and second clock signals by selecting the one of the third clock signals and controlling the phase adjustment of the output third clock signal.

Example 2 includes the system of Example 1, wherein the coarse DLL has glitch-less switching between outputting consecutive ones of the third clock signals.

Example 3 includes the system of Example 2, wherein the coarse DLL includes a plurality of pass transistors to blend the consecutive ones of the third clock signals during the glitch-less switching.

Example 4 includes the system of Example 1, wherein the control circuit has an unlimited phase acquisition range of the first and second clock signals.

Example 5 includes the system of Example 1, wherein there are more than four third clock signals generated by the coarse DLL, the third clock signals are evenly spaced and span the clock period of the first clock signal, and the fine DLL has a phase adjustment range of at least twice and no more than four times the spacing of the third clock signals. Recall that evenly spaced refers to a spacing within an acceptable tolerance and is not intended to imply an excessively rigid or otherwise unattainable limitation.

Example 6 includes the system of Example 1, wherein the number of third clock signals exceeds the ratio of the speed of the first clock domain to the speed of the second clock domain.

Example 7 includes the system of Example 1, further including a phase detector in the first clock domain, to compare the phases of the first and second clock signals, wherein the control circuit aligns the phases of the first and second clock signals by using the compared phases.

Example 8 includes the system of Example 7, further including: a first clock divider in the first clock domain, to divide the first clock signal; and a second clock divider in the second data circuit, to generate the second clock signal by dividing the fourth clock signal; wherein the phase detector compares the phases of the first and second clock signals by comparing the phase of the divided first clock signal to the phase of the second clock signal.

Example 9 is a method of clock alignment, the method including: generating, by a clock generator in a first clock domain, a first clock signal to drive a first data circuit in the first clock domain; generating a second clock signal by a second data circuit in a second clock domain slower than the first clock domain; transferring, by the second data circuit, data to or from the first data circuit in synchronization with the second clock signal; generating, by a coarse delay-locked loop (DLL), third clock signals having corresponding consecutive phase offsets from the first clock signal; outputting, by the coarse DLL, a selected one of the third clock signals; generating, by a fine DLL, a fourth clock signal to drive the second data circuit, by adjusting the phase of the output third clock signal; and aligning, by a control circuit, the phases of the first and second clock signals by selecting the one of the third clock signals and controlling the phase adjustment of the output third clock signal.

Example 10 includes the method of Example 9, further including glitch-less switching, by the coarse DLL, between outputting consecutive ones of the third clock signals.

Example 11 includes the method of Example 10, wherein the glitch-less switching includes blending, by a plurality of pass transistors of the coarse DLL, the consecutive ones of the third clock signals.

Example 12 includes the method of Example 9, wherein the control circuit has an unlimited phase acquisition range of the first and second clock signals.

Example 13 includes the method of Example 9, wherein there are more than four third clock signals generated by the coarse DLL, the third clock signals are evenly spaced and span the clock period of the first clock signal, and the fine DLL has a phase adjustment range of at least twice and no more than four times the spacing of the third clock signals.

Example 14 includes the method of Example 9, wherein the number of third clock signals exceeds the ratio of the speed of the first clock domain to the speed of the second clock domain.

Example 15 includes the method of Example 9, further including comparing, by a phase detector in the first clock domain, the phases of the first and second clock signals, wherein aligning the phases of the first and second clock signals includes using the compared phases.

Example 16 includes the method of Example 15, further including: dividing the first clock signal by a first clock divider in the first clock domain; and generating, by a second clock divider in the second data circuit, the second clock signal by dividing the fourth clock signal; wherein comparing the phases of the first and second clock signals includes comparing the phase of the divided first clock signal to the phase of the second clock signal.

Example 17 is a clock alignment system including: a first data circuit in a first clock domain; a clock generator in the first clock domain, to generate a first clock signal to drive the first data circuit; a second data circuit in a second clock domain slower than the first clock domain by at least a factor of four, the second data circuit being to generate a second clock signal and to transfer data to the first data circuit in synchronization with the second clock signal; a coarse delay-locked loop (DLL) to generate at least eight third clock signals from the first clock signal, and to output a selected one of the third clock signals, the third clock signals having corresponding evenly spaced phase offsets from the first clock signal and that span the clock period of the first clock signal; a fine DLL to generate a fourth clock signal to drive the second data circuit, by adjusting the phase of the output third clock signal; a phase detector in the first clock domain, to compare the phases of the first and second clock signals; and a control circuit to align the phases of the first and second clock signals using the compared phases by selecting the one of the third clock signals and controlling the phase adjustment of the output third clock signal.

Example 18 includes the system of Example 17, wherein the coarse DLL has glitch-less switching between outputting consecutive ones of the third clock signals.

Example 19 includes the system of Example 18, wherein the coarse DLL includes a plurality of pass transistors to blend the consecutive ones of the third clock signals during the glitch-less switching.

Example 20 includes the system of Example 17, wherein the control circuit has an unlimited phase acquisition range of the first and second clock signals.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. In addition, various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A clock alignment system comprising:
   a clock generator configured to generate a first clock signal in a first clock domain to drive a first data circuit in the first clock domain;
   a second data circuit in a second clock domain slower than the first clock domain, the second data circuit being configured to generate a second clock signal and to transfer data to or from the first data circuit in synchronization with the second clock signal;
   a coarse delay-locked loop (DLL) configured to generate third clock signals having corresponding phase offsets from the first clock signal, and to output a selected one of the third clock signals, wherein the coarse DLL has glitch-less switching between outputting consecutive ones of the third clock signals;
   a fine DLL configured to generate a fourth clock signal to drive the second data circuit, by adjusting a phase of the selected third clock signal; and
   a control circuit configured to align the phases of the first and second clock signals by selecting the one of the third clock signals and controlling the phase adjustment of the selected third clock signal.

2. The system of claim 1, wherein the coarse DLL comprises a plurality of pass transistors to blend the consecutive ones of the third clock signals during the glitch-less switching.

3. The system of claim 1, wherein the control circuit has an unlimited phase acquisition range of the first and second clock signals.

4. The system of claim 1, wherein
   there are more than four third clock signals generated by the coarse DLL,
   the third clock signals are evenly spaced and span the clock period of the first clock signal, and
   the fine DLL has a phase adjustment range of at least twice and no more than four times the spacing of the third clock signals.

5. The system of claim 1, wherein the number of third clock signals exceeds the ratio of the speed of the first clock domain to the speed of the second clock domain.

6. The system of claim 1, further comprising a phase detector in the first clock domain, to compare the phases of the first and second clock signals, wherein the control circuit aligns the phases of the first and second clock signals by using the compared phases.

7. The system of claim 6, further comprising:
   a first clock divider in the first clock domain and configured to divide the first clock signal; and
   a second clock divider in the second data circuit and configured to generate the second clock signal by dividing the fourth clock signal,
   wherein the phase detector is configured to compare the phases of the first and second clock signals by comparing the phase of the divided first clock signal to the phase of the second clock signal.

8. A method of clock alignment, the method comprising:
   generating, by a clock generator in a first clock domain, a first clock signal to drive a first data circuit in the first clock domain;
   generating a second clock signal by a second data circuit in a second clock domain slower than the first clock domain;
   transferring, by the second data circuit, data to or from the first data circuit in synchronization with the second clock signal;
   generating, by a coarse delay-locked loop (DLL), third clock signals having corresponding phase offsets from the first clock signal;

outputting, by the coarse DLL, a selected one of the third clock signals;

generating, by a fine DLL, a fourth clock signal to drive the second data circuit, by adjusting a phase of the selected third clock signal;

comparing, by a phase detector in the first clock domain, the phases of the first and second clock signals, wherein aligning the phases of the first and second clock signals comprises using the compared phases; and aligning, by a control circuit, the phases of the first and second clock signals by selecting the one of the third clock signals and controlling the phase adjustment of the selected third clock signal.

9. The method of claim 8, further comprising glitch-less switching, by the coarse DLL, between outputting consecutive ones of the third clock signals.

10. The method of claim 9, wherein the glitch-less switching comprises blending, by a plurality of pass transistors of the coarse DLL, the consecutive ones of the third clock signals.

11. The method of claim 8, wherein the control circuit has an unlimited phase acquisition range of the first and second clock signals.

12. The method of claim 8, wherein
there are more than four third clock signals generated by the coarse DLL,
the third clock signals are evenly spaced and span the clock period of the first clock signal, and
the fine DLL has a phase adjustment range of at least twice and no more than four times the spacing of the third clock signals.

13. The method of claim 8, wherein the number of third clock signals exceeds the ratio of the speed of the first clock domain to the speed of the second clock domain.

14. The method of claim 8, further comprising:
dividing the first clock signal by a first clock divider in the first clock domain; and
generating, by a second clock divider in the second data circuit, the second clock signal by dividing the fourth clock signal;
wherein comparing the phases of the first and second clock signals comprises comparing the phase of the divided first clock signal to the phase of the second clock signal.

15. A clock alignment system comprising:
a first data circuit configured to operate in a first clock domain;
a clock generator in the first clock domain, and configured to generate a first clock signal to drive the first data circuit;
a second data circuit configured to operate in a second clock domain slower than the first clock domain by at least a factor of four, the second data circuit further configured to generate a second clock signal and to transfer data to the first data circuit in synchronization with the second clock signal;
a coarse delay-locked loop (DLL) configured to generate at least eight third clock signals from the first clock signal, and to output a selected one of the third clock signals, the third clock signals having corresponding evenly spaced phase offsets from the first clock signal that span the clock period of the first clock signal;
a fine DLL to generate a fourth clock signal to drive the second data circuit, by adjusting a phase of the selected third clock signal;
a phase detector configured to operate in the first clock domain, and further configured to compare the phases of the first and second clock signals; and
a control circuit configured to align the phases of the first and second clock signals using the compared phases by selecting the one of the third clock signals and controlling the phase adjustment of the selected third clock signal.

16. The system of claim 15, wherein the coarse DLL has glitch-less switching between outputting consecutive ones of the third clock signals.

17. The system of claim 16, wherein the coarse DLL comprises a plurality of pass transistors to blend the consecutive ones of the third clock signals during the glitch-less switching.

18. The system of claim 15, wherein the control circuit has an unlimited phase acquisition range of the first and second clock signals.

* * * * *